(12) United States Patent
Honda et al.

(10) Patent No.: US 10,666,320 B2
(45) Date of Patent: May 26, 2020

(54) RINGING SUPPRESSION CIRCUIT

(71) Applicant: DENSO CORPORATION, Kariya, Aichi-pref. (JP)

(72) Inventors: Takuya Honda, Kariya (JP); Hirofumi Isomura, Kariya (JP); Tomohisa Kishigami, Kariya (JP)

(73) Assignee: DENSO CORPORATION, Kariya (JP)

( * ) Notice: Subject to any disclaimer, the term of this patent is extended or adjusted under 35 U.S.C. 154(b) by 0 days.

(21) Appl. No.: 16/201,216

(22) Filed: Nov. 27, 2018

(65) Prior Publication Data

US 2019/0097681 A1 Mar. 28, 2019

Related U.S. Application Data

(63) Continuation of application No. PCT/JP2017/013943, filed on Apr. 3, 2017.

(30) Foreign Application Priority Data

Jun. 22, 2016 (JP) .................................. 2016-123497

(51) Int. Cl.
*H04B 3/42* (2006.01)
*H04L 25/02* (2006.01)
*H03K 19/0175* (2006.01)
*H03K 5/1252* (2006.01)

(52) U.S. Cl.
CPC ............. *H04B 3/42* (2013.01); *H03K 5/1252* (2013.01); *H03K 19/0175* (2013.01); *H04L 25/02* (2013.01)

(58) Field of Classification Search
CPC combination set(s) only.
See application file for complete search history.

(56) References Cited

U.S. PATENT DOCUMENTS

2009/0262796 A1 10/2009 Wada
2011/0169547 A1\* 7/2011 Suzuki ............. H03K 19/00361
327/384
2012/0293230 A1 11/2012 Mori et al.
(Continued)

FOREIGN PATENT DOCUMENTS

JP 2000-261508 A 9/2000
JP 2002-261843 A 9/2002
(Continued)

*Primary Examiner* — Sam K Ahn
*Assistant Examiner* — Amneet Singh
(74) *Attorney, Agent, or Firm* — Posz Law Group, PLC

(57) ABSTRACT

A ringing suppression circuit is provided at one or more nodes each having a communication circuit executing communication with another node by transmitting a differential signal through a pair of communication lines connected to the nodes. The circuit includes a suppression circuit and an operation mode controller: The suppression circuit is configured to execute a suppression operation for suppressing ringing in the differential signal. The operation mode controller is configured to set an operation mode of the suppression circuit to one of: a normal operation mode, which enables the suppression circuit to execute the suppression operation in response to detecting a change in a level of the differential signal, and a permanent off mode, which disables the suppression circuit to execute the suppression operation on a steady basis.

6 Claims, 14 Drawing Sheets

(56) References Cited

U.S. PATENT DOCUMENTS

| | | | |
|---|---|---|---|
| 2013/0099849 A1* | 4/2013 | Suzuki | H03K 19/00361 327/384 |
| 2014/0072025 A1 | 3/2014 | Matsudaira et al. | |
| 2015/0156040 A1 | 6/2015 | Matsudaira et al. | |
| 2016/0020826 A1 | 1/2016 | Fujii et al. | |

FOREIGN PATENT DOCUMENTS

| | | |
|---|---|---|
| JP | 4767025 B2 | 9/2011 |
| JP | 2013-042384 A | 2/2013 |
| JP | 2014-011776 A | 1/2014 |

* cited by examiner

⟨NORMAL OPERATION MODE⟩

PULL-DOWN RESISTOR
⟨PERMANENT OFF MODE⟩

(DIFFERENTIAL VOLTAGE WAVEFORM OF A BUS
WITH A NODE HAVING TERMINAL RESISTANCE IN STAR-TOPOLOGY ROUTING)

FIG. 7

| SEL2 | SEL1 | MODE |
|---|---|---|
| L(GND) | L(GND) | PERMANENT ON |
| L(GND) | H(VCC) | NORMAL OPERATION |
| H(VCC) | L(GND) | PERMANENT OFF |
| H(VCC) | H(VCC) | PERMANENT OFF |

⟨NORMAL OPERATION MODE⟩

⟨PERMANENT OFF MODE⟩

⟨PERMANENT ON MODE⟩

RINGING SUPPRESSION CIRCUIT

CROSS REFERENCE TO RELATED APPLICATIONS

The present application is a continuation application of International Patent Application No. PCT/JP2017/013943 filed on Apr. 3, 2017, which designated the U.S. and claims the benefit of priority from Japanese Patent Application No. 2016-123497 filed on Jun. 22, 2016. The entire disclosures of all of the above applications are incorporated herein by reference.

TECHNICAL FIELD

The present disclosure relates to a ringing suppression circuit configured to suppress the occurrence of ringing in a differential signal transmitted through a pair of communication lines.

BACKGROUND

When transmitting a digital signal through a transmission line, a waveform distortion (i.e., overshoot or undershoot) known as ringing may occur in the signal due to signal reflection when the signal level changes. A variety of techniques have been proposed for suppressing the waveform distortion.

SUMMARY

The present disclosure provides a ringing suppression circuit suppressing an oscillation in a differential signal transmitted through a pair of communication lines connected to the ringing suppression circuit.

BRIEF DESCRIPTION OF DRAWINGS

The above object, the other objects, features, and advantages of the present disclosure will become more apparent from the following detailed description with reference to the accompanying drawings, in which:

FIG. 7 shows the relationship between a selection signal and the operation mode of a suppressor;

DETAILED DESCRIPTION

Figure 1:
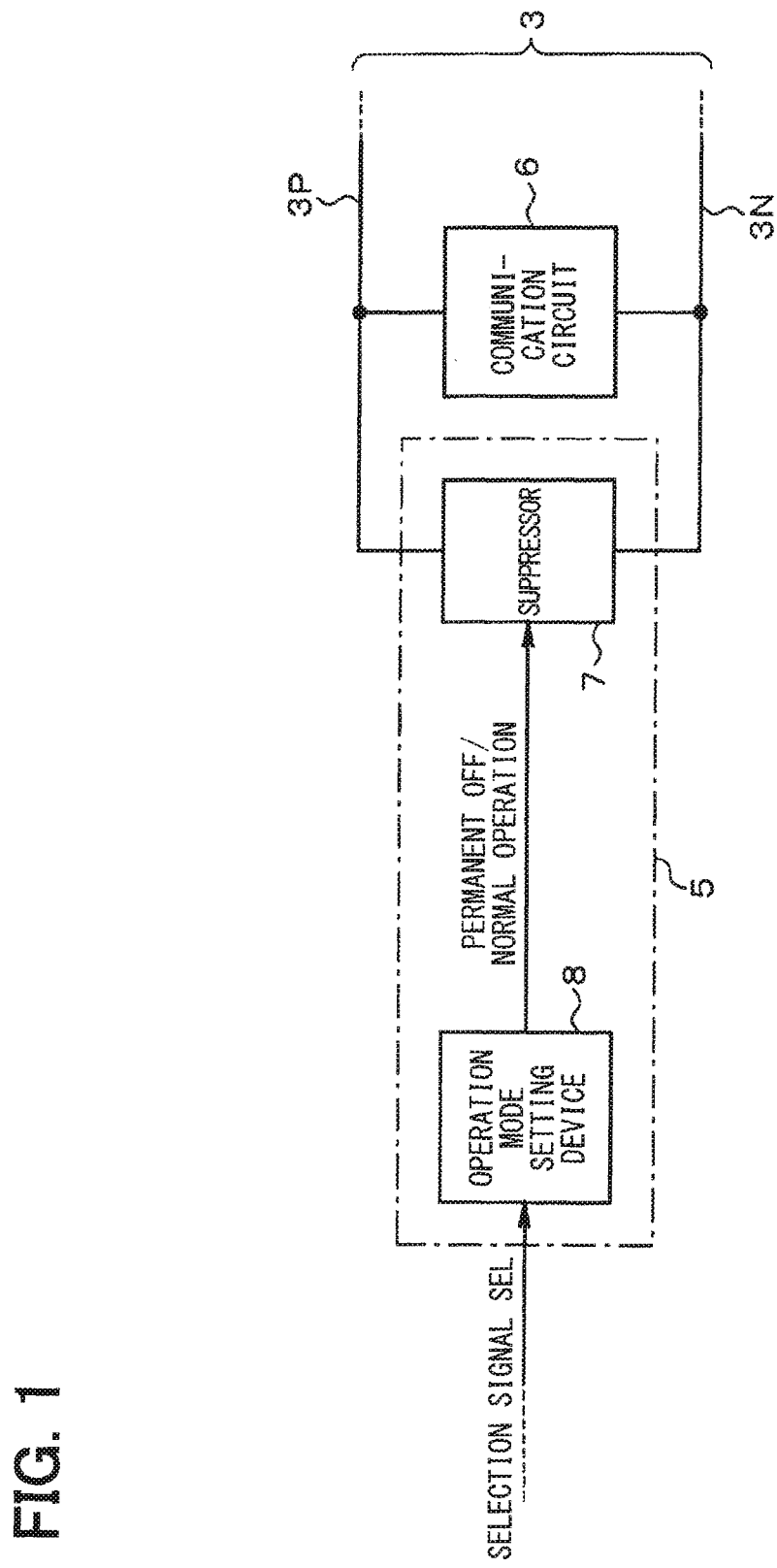
FIG. 1 illustrates the configuration of a ringing suppression circuit schematically according to a first embodiment.

When transmitting a digital signal through a transmission line including a pair of communication lines, a waveform distortion (i.e., overshoot or undershoot) known as ringing may occur in the signal received at a receiver due to signal reflection at the timing during which the signal's level has been changing. A variety of techniques have been proposed for suppressing the waveform distortion For example, a ringing suppression circuit may be configured with a simpler structure to suppress ringing for enhancing the communication fidelity. For this ringing suppression circuit, a switching element is provided in a communication bus and is configured to be turned on with a predetermined time period when a change in a signal's level is detected.

However, the following situations may happen in the above-mentioned ringing suppression circuit. When the ringing suppression circuit is in operation, an on-resistor of the switching element in the ringing suppression circuit and a termination resistor are connected in parallel between the communication lines. As a result, the impedance between the communication lines is combined parallel impedance. Hence, the impedance mismatch occurs.

The present disclosure provides a ringing suppression circuit that may be used for different types of nodes.

The ringing suppression circuit according to the present disclosure is provided at one or more nodes each having a communication circuit executing communication with another node by transmitting a differential signal through a pair of communication lines connected to the nodes. The circuit includes a suppression circuit and an operation mode controller. The suppression circuit is configured to execute a suppression operation for suppressing ringing in the differential signal. The operation mode controller is configured to set an operation mode of the suppressor to one of: a normal operation mode, which enables the suppression circuit to execute the suppression operation in response to detecting a change in a level of the differential signal; and a permanent off mode, which disables the suppression circuit to execute the suppression operation on a steady basis.

When the ringing suppression circuit according to the above configuration is provided at a node without having a termination resistor, the suppression circuit may be set to the normal operation mode for executing a suppression operation to suppress the ringing occurred with the communication. When the ringing suppression circuit according to the above configuration is provided at a node with having a termination resistor, the suppression circuit may be set to the permanent off mode for preventing from the occurrence of impedance mismatch. As a result, the impedance matching is achieved by the termination resistor when there is a change in the level of the differential signal. Hence, it is possible to suppress the occurrence of ringing. The above-mentioned configuration may be used for any type of node as an advantageous effect in this disclosure.

Hereinafter, several embodiments of the present disclosure will be described with reference to the drawings. In the following embodiments, substantially identical elements will be indicated by the same reference sign and the explanation thereof will not be omitted.

First Embodiment

The following describes a first embodiment with reference to FIG. 1 to FIG. 5.

Figure 2:
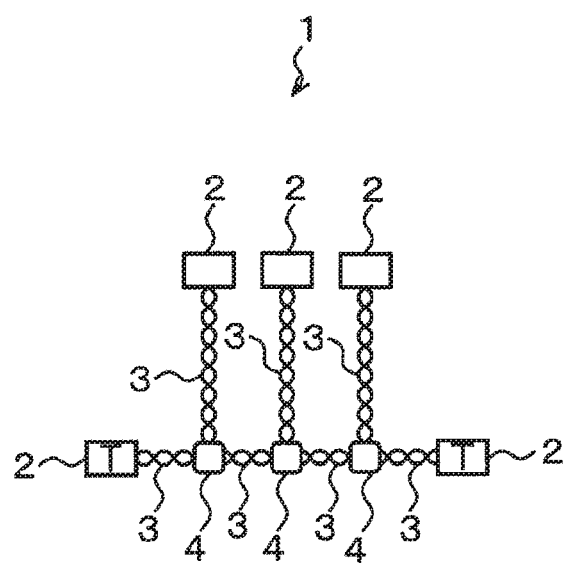
FIG. 2 illustrates the configuration of a communication network schematically.

The communication network 1 shown in FIG. 2 is connected to a plurality of nodes through a transmission line 3 made of a pair of twisted lines for controlling the communication among the plurality of nodes 2 mounted to a vehicle. Each node 2 is an electronic control device that controls an actuator based on the information from a sensor or the like configured to detect a vehicle state.

A communication circuit (not shown) is provided to each node 2. The node 2 converts the transmission data or receiving data to a communication signal according to a communication protocol in the transmission line 3, for example, CAN protocol, and carries out communication with the other node 2. A branch connector 4 is provided in the transmission line 3. In other words, the branch connector 4 is provided at the middle of the communication bus. The branch connector 4 is configured to branch out the transmission line 3.

The nodes 2 are illustrated in FIG. 2. It is noted that the rectangle indicated with the letter "T" refers to a node having a terminating resistor outside the node. In the following description, the node having the termination resistor is called the node 2T. In addition, the node 2 with only the illustration of a rectangular shape, in other words, without the indication of the letter "T", refers to a node without a termination resistor. In this situation, the resistance value of the termination resistor is, for example, 120 ohms.

The ringing suppression circuit 5, which is illustrated in FIG. 1, and the communication circuit 6 are provided to the node 2 illustrated in FIG. 2. The ringing suppression circuit 5 includes a suppressor 7 and an operation mode setting device 8. The suppressor 7 lowers the impedance of the transmission line 3, which has a high-potential signal line 3P and a low-potential signal line 3N, to carry out a suppression operation for suppressing the ringing occurred with the transmission of a differential signal. The high-potential signal line 3P and the low-potential signal line 3N correspond to a pair of communication lines. Hereinafter, both signal lines are referred to as a signal line 3P and a signal line 3N for simplicity.

The operation mode setting device 8 sets the operation mode of the suppressor 7. In this situation, it is possible to set the suppressor 7 to either the normal operation mode or the permanent off mode as one of the two operation modes of the suppressor 7. The normal operation mode is an operation mode for enabling the suppressor 7 to carry out the normal operation. In particular, the suppressor 7 carries out the suppressing operation in response to detecting a change in a signal level of a differential signal. Additionally, the permanent off mode refers to an operation mode for disabling the suppression operation to be carried out permanently.

The operation mode setting device 8 sets the operation mode of the suppressor 7 based on the signal level of the selection signal SEL provided from outside. The selection signal SEL refers to a signal for selecting the operation mode of the suppressor 7. In particular, the selection signal SEL indicates the selection of the normal operation mode when the selection signal SEL is at an L-level, and indicates the selection of the permanent off state when the selection signal SEL is at an H-level. The H-level of the selection signal SEL corresponds to a power supply voltage Vcc in a circuit, and the L-level of the selection signal SEL corresponds to a ground (GND) as a reference potential level in the circuit.

Figure 3:
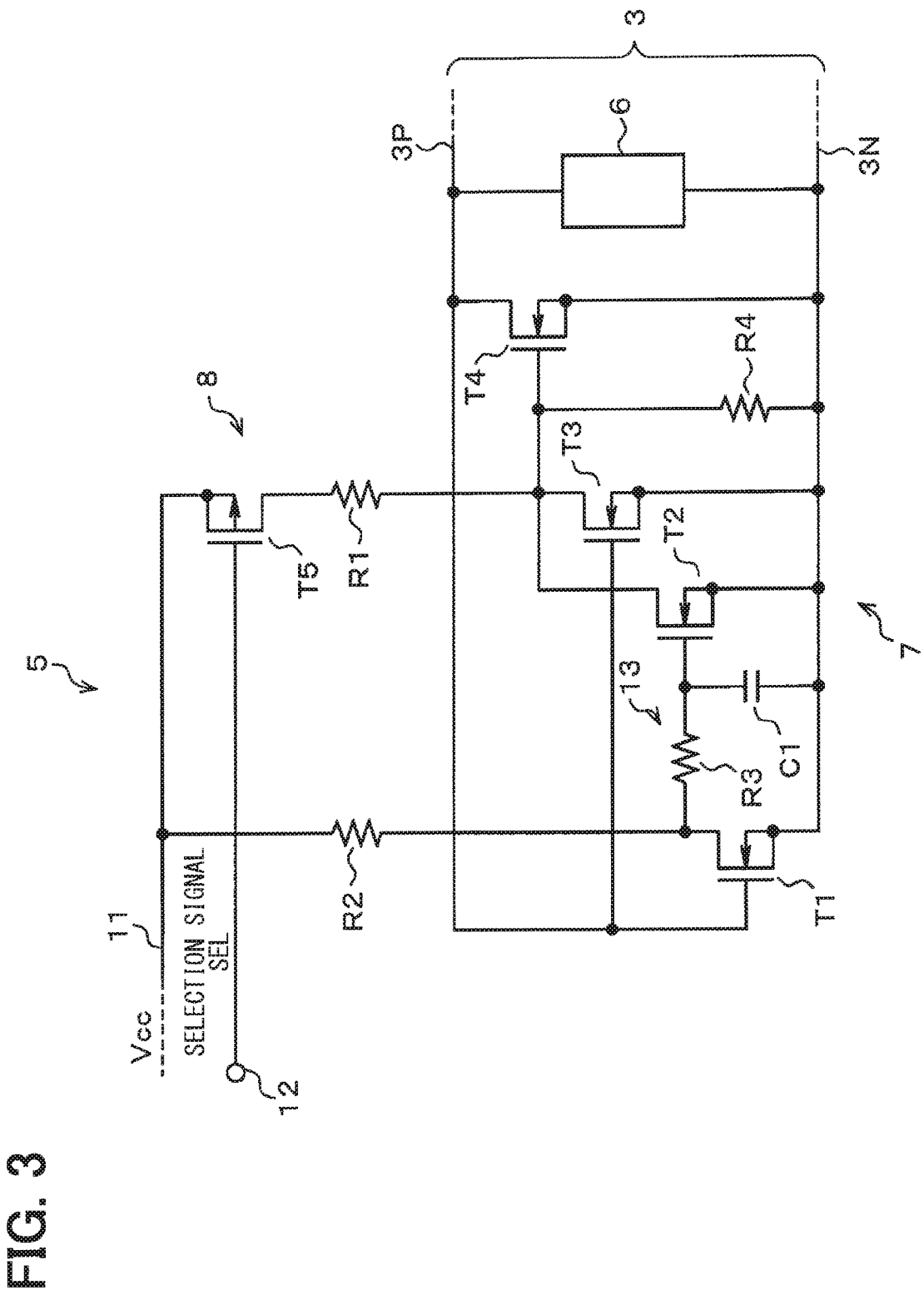
FIG. 3 illustrates the particular configuration of the ringing suppression circuit schematically.

For the particular configuration of the ringing suppression circuit 5, the configuration illustrated in FIG. 3 may be used as one of the examples. As illustrated in FIG. 3, the ringing suppression circuit 5 and the communication circuit 6 are connected in parallel between the signal line 3P and the signal line 3N. The ringing suppression circuit 5 includes transistors T1 to T4 and a transistor T5. The four transistors T1 to T4 are N-channel MOSFETs. The sources of the four transistors are connected to the signal line 3N. The transistor T5 is a P-channel MOSFET.

The gates of the transistors T1 and T3 are connected to the signal line 3P. The drain of the transistor T4 is connected to the signal line 3P. The respective drains of the transistors T2 and T3 are connected to the gate of the transistor T4 and also connected to the drain of the transistor T5 through a resistor R1.

The source of the transistor T5 is connected to a power supply line 11. The power supply voltage Vcc is supplied to the power supply line 11 for operating the ringing suppression circuit 5. The gate of the transistor T5 is connected to an input terminal 12, which receives an input of the selection signal SEL from outside. Accordingly, the transistor T5 is turned on and off according to the selection signal SEL, which is sent to the gate.

The drain of the transistor T1 is connected to the power supply line 11 through a resistor R2, and is connected to the gate of the transistor T2 through a resistor R3. The gate of the transistor T2 is connected to the signal line 3N through the capacitor C1. The resistor R3 and the capacitor C1 are configured as an RC filter circuit 13. The gate of the transistor T4 is connected to the signal line 3N through the resistor R4.

The suppressor 7 includes the transistors T1 to T4, the resistors R1 to R3 and the capacitor C1. The operation mode setting device 8 includes the transistor T5 and the resistor R4. The resistance value of the resistor R4 is set to be larger than the resistance value of the resistor R1.

Figure 4A:
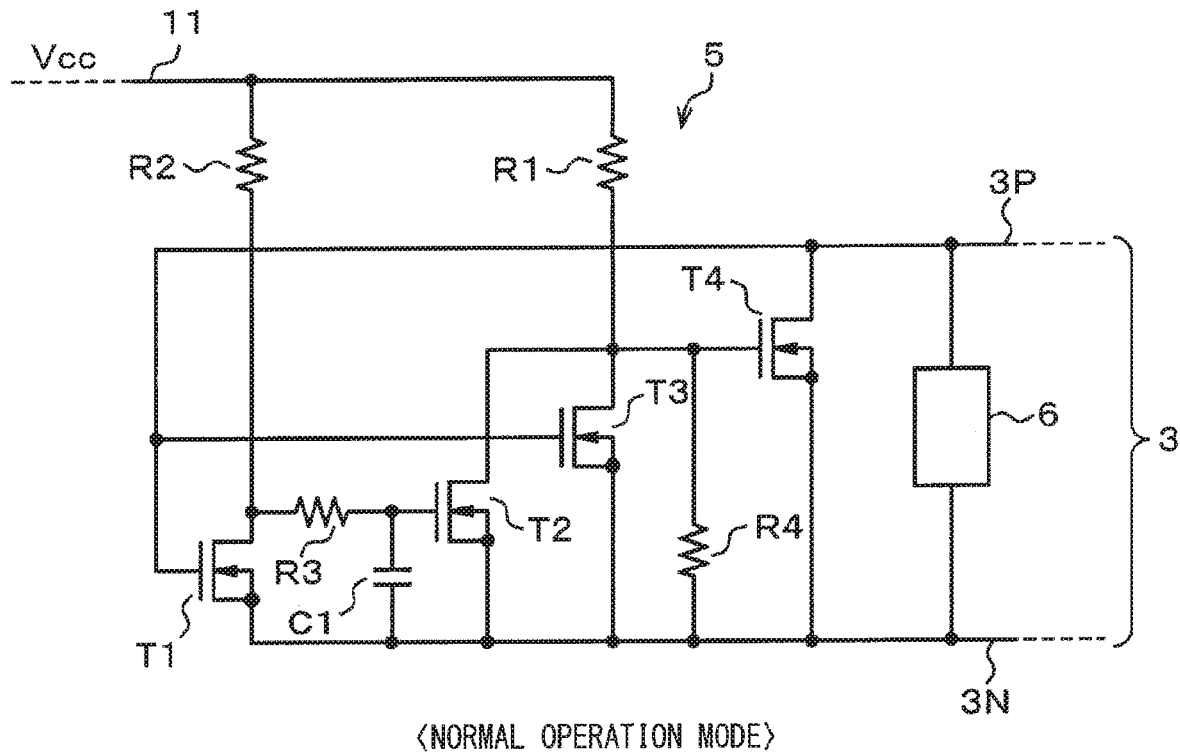
FIG. 4A illustrates schematically a circuit state of the ringing suppression circuit when setting a suppressor to a normal operation mode.
Figure 4B:
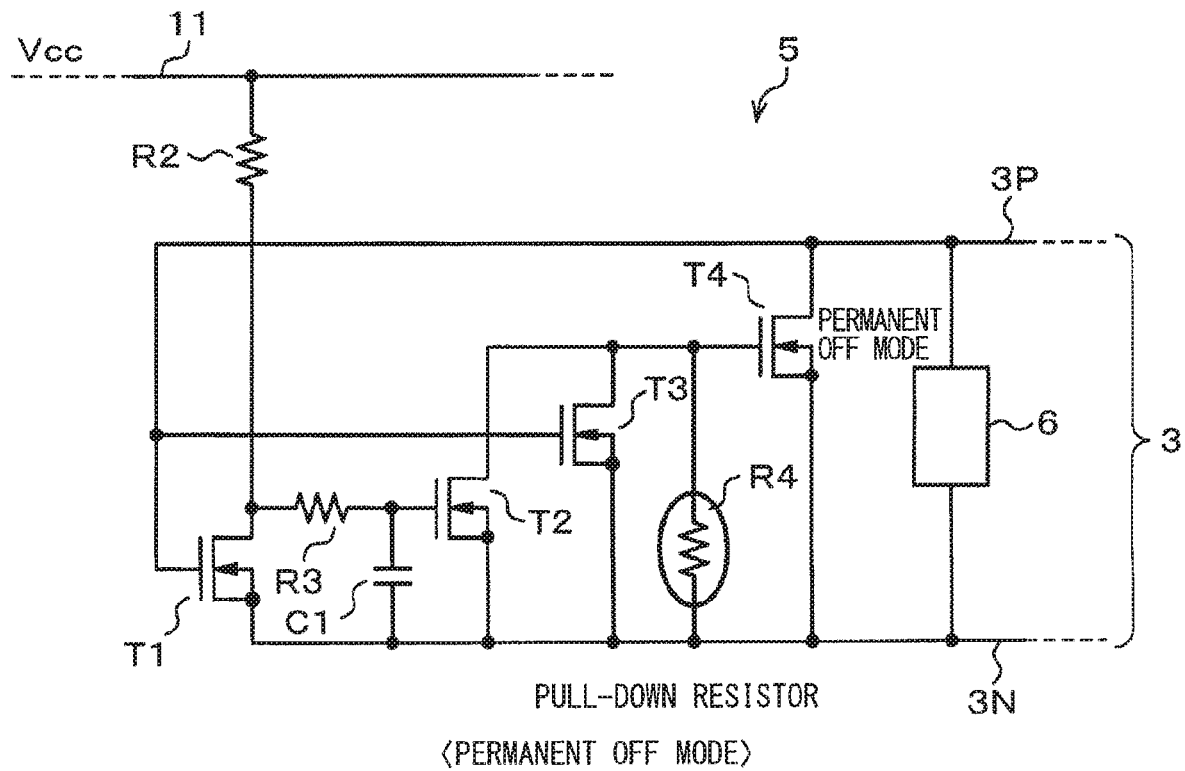
FIG. 4B illustrates schematically the circuit state of the ringing suppression circuit when setting the suppressor to a permanent off state.

The following describes the operation of the configuration with reference to FIGS. 4A and 4B. FIGS. 4A and 4B omit the illustration of circuit elements which do not function effectively.

[1] Normal Operation Mode

When the suppressor 7 is set to the normal operation mode, the transistor T5 is turned off because the selection signal SEL at the L-level is provided. As illustrated in FIG. 4A, the gate of the transistor T4 is pulled up through the resistor R1. The ringing suppression circuit 5 has a circuit configuration similar to the one illustrated in FIG. 1 of JP 2012-257205 A. According to the ringing suppression circuit 5 illustrated in FIG. 4A in a situation of setting the suppressor 7 to the normal operation mode, the suppressor 7 carries out the ringing suppression operation similar to the one carried out in a typical ringing suppression circuit.

In this situation, the transmission line 3 transmits a binary signal, which has a high level and a low level, as a differential signal. For example, the signal lines 3P and 3N are set at 2.5 V as an intermediate potential level and the differential voltage is 0V at a non-driven state when the power supply voltage is 5 V. The differential signal is at the low level, which is indicated as a recessive level.

When the transmission circuit (not shown) of the communication circuit 6 drives the transmission line 3, the signal line 3P is driven at, for example, 3.5 V or higher, and the signal line 3N is driven at, for example, 2 V or higher. The differential signal is at the high-level that indicates the dominant level. Both ends of the signal lines 3P and 3N are terminated by a termination resistor having 120 ohms even if it is not shown. Accordingly, when the signal level of the differential signal is changed from the high level to the low level, the transmission line 3 is at the non-driven state and the impedance of the transmission line 3 gets larger. Therefore, the ringing occurs in the differential signal waveform.

The ringing suppression circuit 5 turns on the transistor T4 to start the suppression operation carried out by the suppressor 7 when the signal level of the differential signal is changed from the high level to the low level indicative of the recessive level as a trigger. The operation can be achieved as described in the following. When the level of the differential signal is at the high level, the transistor T2 is turned off since the transistors T1 and T3 are turned on. Accordingly, the transistor T4 is at the off state.

Since the transistor T4 is turned to the off state, when the signal level of the differential signal is changed from the high level to the low level, the transistor T4 is turned on because the transistors T1 and T3 are turned off. Thus, the impedance between the signal lines 3P and 3N is lowered when the signal lines 3P and 3N are connected through the on-resistance of the transistor T4. The energy produced by the waveform distortion during a falling-edge period in which the signal level of the differential signal is changed from the high level to the low level is consumed by the on-resistance. Thus, the ringing is suppressed.

[2] Permanent Off Mode

When the suppressor is set to the permanent off mode, the transistor T5 is turned off since the selection signal SEL at the high level is provided. As shown in FIG. 4B, the gate of the transistor T4 is pulled down by the resistor R4. Thus, the transistor T4 is still at the permanent off state regardless of the signal level of the differential signal. Accordingly, the ringing suppression circuit 5 shown in FIG. 4B in which the suppressor 7 is set to the permanent off mode does not carry out the suppression operation for suppressing the ringing.

According to the present embodiment described above, the effects can be attained as described in the following.

When a typical ringing suppression circuit detects a change in the signal level of the differential signal on a steady basis, the switching element provided between the signal lines 3P and 3N is turned on. When the ringing suppression circuit is provided to the node 2T having a termination resistor, the impedance mismatch may occur when the suppression operation is carried out.

Figure 5:
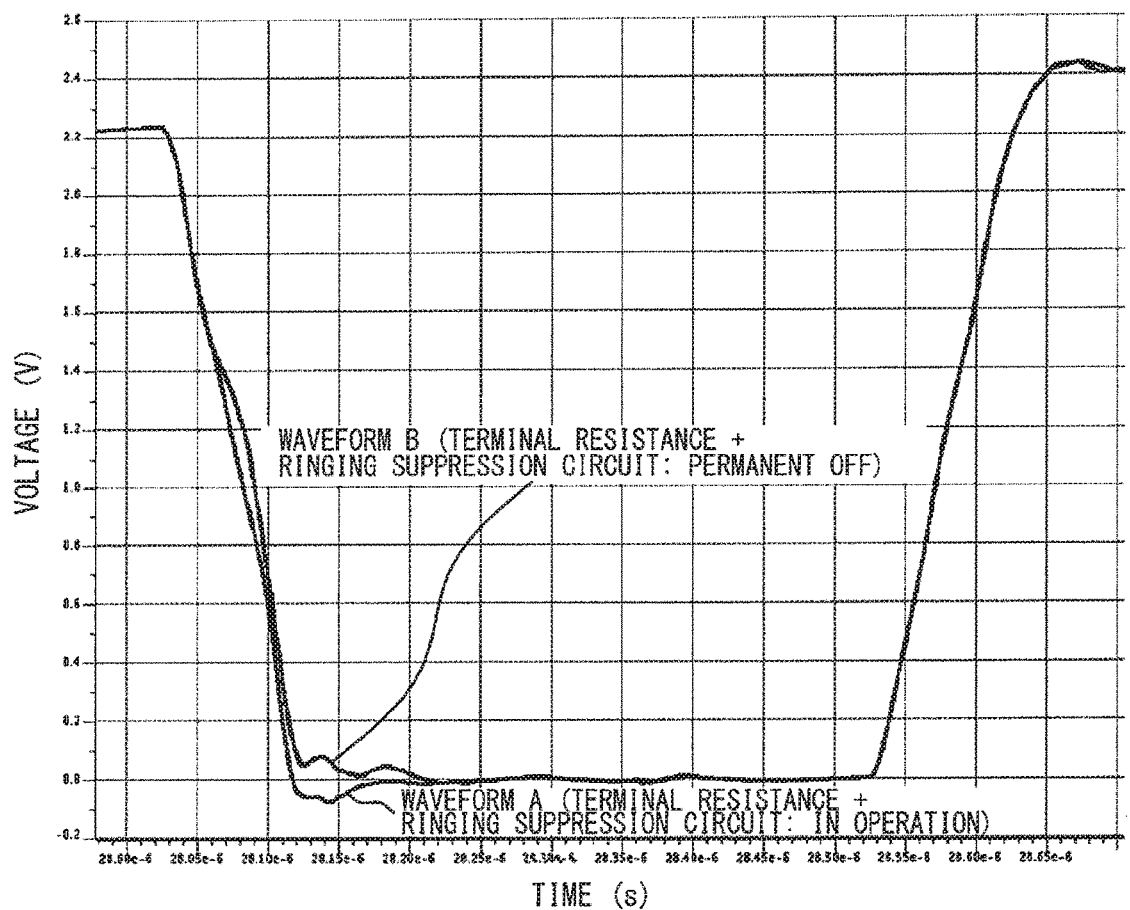
FIG. 5 illustrates the simulation result of the operation of the ringing suppression circuit.

When the impedance mismatch occurs, an overshoot occurs in the waveform of the differential signal as the signal level of the differential signal, that is, the bus is changed from the dominant level to the recessive level as illustrated in the waveform A in FIG. 5. When distortion occurs in the waveform of the differential signal, the noise may be amplified. FIG. 5 illustrates the differential voltage waveform of the communication bus with a node having the termination resistor in a communication network. The communication network is configured by a star-topology transmission line.

In contrast, the ringing suppression circuit 5 according to the present embodiment is possible to set the suppressor 7 to the permanent off mode, which does not carry out the suppression operation on a steady basis, as the operation mode of the suppressor 7. In a situation where the ringing suppression circuit 5 is provided to the node 2T having the termination resistor, when the suppressor 7 is set to the permanent off mode, only the termination resistor is maintained to be connected between the signal lines 3P and 3N. Hence, the impedance mismatch does not occur. As a result, impedance matching can be achieved by the termination resistor even when there is a change in the level of the differential signal. Accordingly, it is possible to suppress the occurrence of ringing when the level of the differential signal, that is, the communication bus is changed from the dominant level to the recessive level as shown in the waveform B in FIG. 5.

It is possible for the ringing suppression circuit 5 according to the present embodiment to set the suppressor 7 at the normal operation mode for carrying out the suppression operation as one of the operation modes of the suppressor 7. In a situation where the ringing suppression circuit 5 is provided at the node without having the termination resistor, it is possible to properly suppress the ringing occurred with the communication according to the suppression operation of the suppressor 7.

It is possible to provide the ringing suppression circuit 5 according to the present embodiment at either the node 2T having the termination resistor or the node 2 without having the termination resistor. In other words, it is possible to generate an advantageous effect in the ringing suppression circuit 5 according to the present embodiment regardless of the type of the communication node.

In contrast to a typical ringing suppression circuit, the ringing suppression circuit 5 according to the present embodiment is possible to achieve the switching of the above-mentioned operation mode by adding the input terminal 12, the transistor T5 and the resistor R4. The input terminal 12 is configured to receive an input of the selection signal SEL. The transistor T5 is configured to switch whether to pull up the gate of the transistor T4 based on the selection signal SEL. The resistor R4 is configured to pull down the gate of the transistor T4. According to the present embodiment, in contrast to the typical ringing suppression circuit, it is possible to generate the above-mentioned effect by only adding a simple configuration.

Second Embodiment

The following describes a second embodiment with reference to FIG. 6 to FIG. 9.

Figure 6:
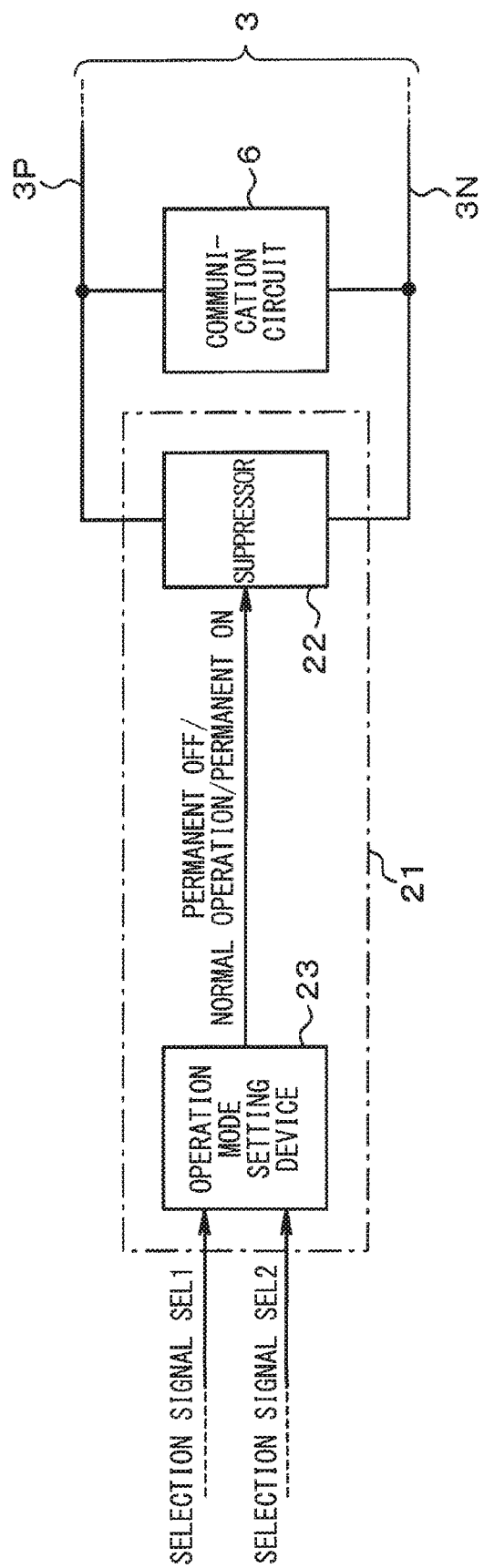
FIG. 6 schematically illustrates the configuration of a ringing suppression circuit according to the second embodiment.

As shown in FIG. 6, a ringing suppression circuit 21 according to the present embodiment includes a suppressor 22 and an operation mode setting device 23. The suppressor 22 carries out the suppression operation, which is similar to the one carried out by the suppressor 7 according to the first embodiment. However, the suppressor 22 may be set to any one of three operation modes: the normal operation mode, permanent off mode and permanent on mode. The permanent on mode refers to an operation mode that the suppression operation is carried out on a steady basis.

The operation mode setting device 23 controls the suppressor 22 to be at any one of the three operation modes based on the selection signals SEL1 and SEL2 provided from outside. The selection signals SEL1 and SEL2 refer to signals for selecting the operation mode of the suppressor 22. The H-level and L-level of the selection signals SEL1 and SEL2 respectively correspond to the power supply voltage Vcc and the ground (GND).

Figure 8:
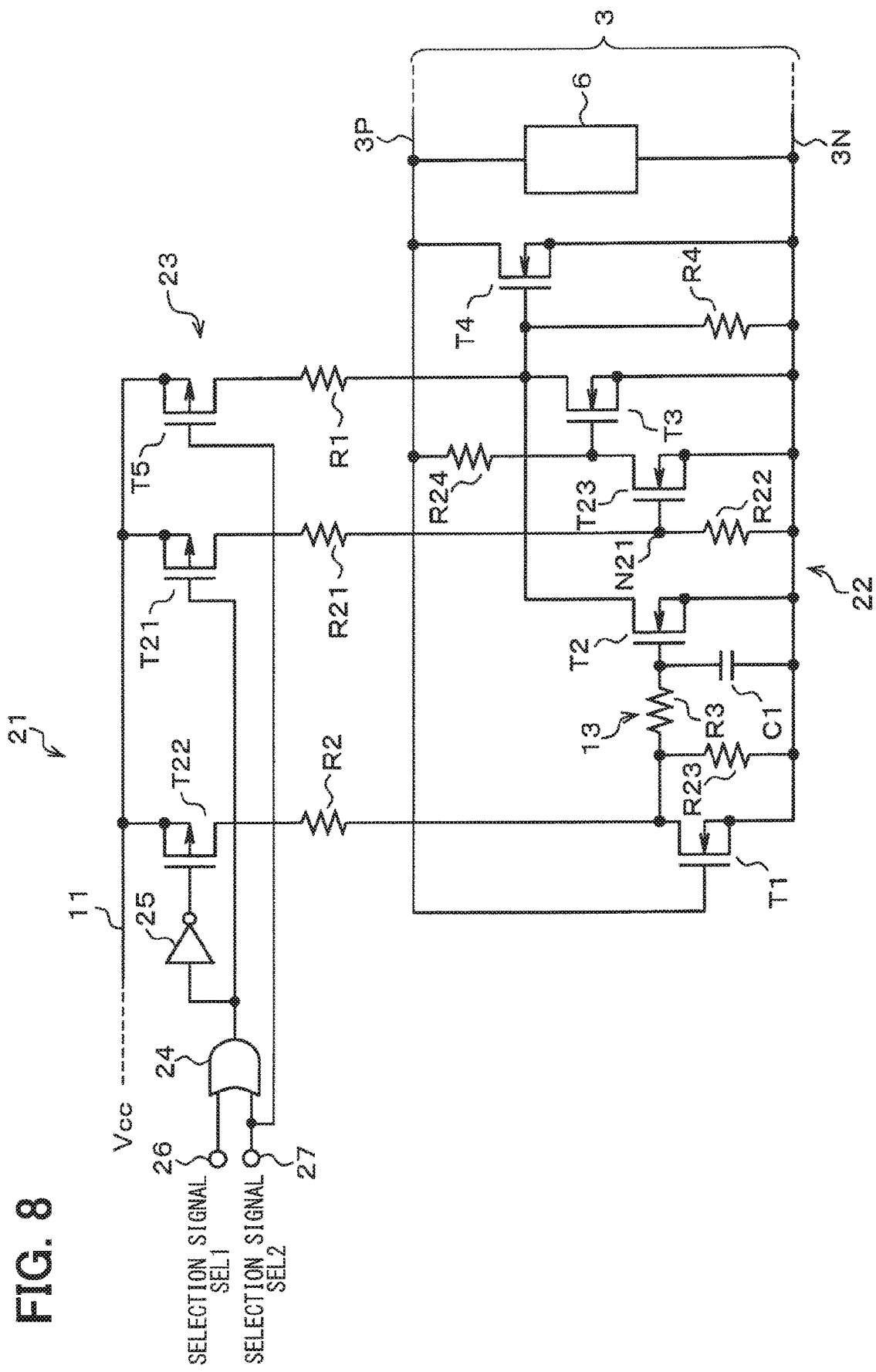
FIG. 8 illustrates schematically the particular configuration of the ringing suppression circuit.

In particular, as shown in FIG. 7, when each the selection signals SEL1 and SEL2 is at the L-level, it is indicated that the permanent on mode is selected; and when the selection signal SEL 1 is at the H-level and the selection signal SEL2 is at the L-level, it is indicated that the normal operation mode is selected. Additionally, when the selection signal SEL 2 is at the H-level, it is indicated that the permanent off mode is selected regardless of the signal level of the selection signal SELL As a practical configuration of the ringing suppression circuit 21, a configuration shown in FIG. 8 can be adopted, for example. As shown in FIG. 8, the ringing suppression circuit 21 additionally includes an OR circuit 24, an inverter circuit 25, transistors T21, T22, which are P-channel MOSFETs, a transistor T23, which is an N-channel MOSFET, and resistors R21 to R24, as compared with the configuration shown in the ringing suppression circuit 5 according to the first embodiment in FIG. 3.

Input terminals of the OR circuit 24 are respectively connected to input terminals 26 and 27, which respectively receive the selection signals SEL1 and SEL2. The output signal of the OR circuit 24 is sent to the inverter circuit 25 and the gate of the transistor T21. The output signal of the inverter circuit 25 is sent to the gate of the transistor T22. In this situation, the selection signal SEL2 is sent to the gate of the transistor T5.

The respective sources of the transistors T21 and T22 are connected to the power supply line 11, The drain of the transistor T21 is connected to the signal 3N through the resistors R21 and R22. The drain of the transistor T22 is connected to the drain of the transistor T1 through the resistor R2. In this situation, the drain of the transistor T1 is connected to the signal line 3N through the resistor R23.

The common connection point N21 located between the resistors R21 and R22 is connected to the gate of the transistor T23. The drain of the transistor T23 is connected to the gate of the transistor T3 and is connected to the signal line 3P through the resistor R24. The source of the transistor T23 is connected to the signal line 3N.

According to the above-mentioned configuration, the suppressor 22 includes the transistors T1 to T4, the resistors R1 to R3 and the capacitor C1. The operation mode setting device 23 includes the OR circuit 24, the inverter circuit 25, the transistors T5, T21 to T23 and the resistors R4, R21 to R24. The resistance values of the resistors R21 and R22 are set to values such that the voltage at the common connection point 21 is at a voltage value enabling the transistor 23 to turn on when the transistor T21 is turned on.

Figure 9A:
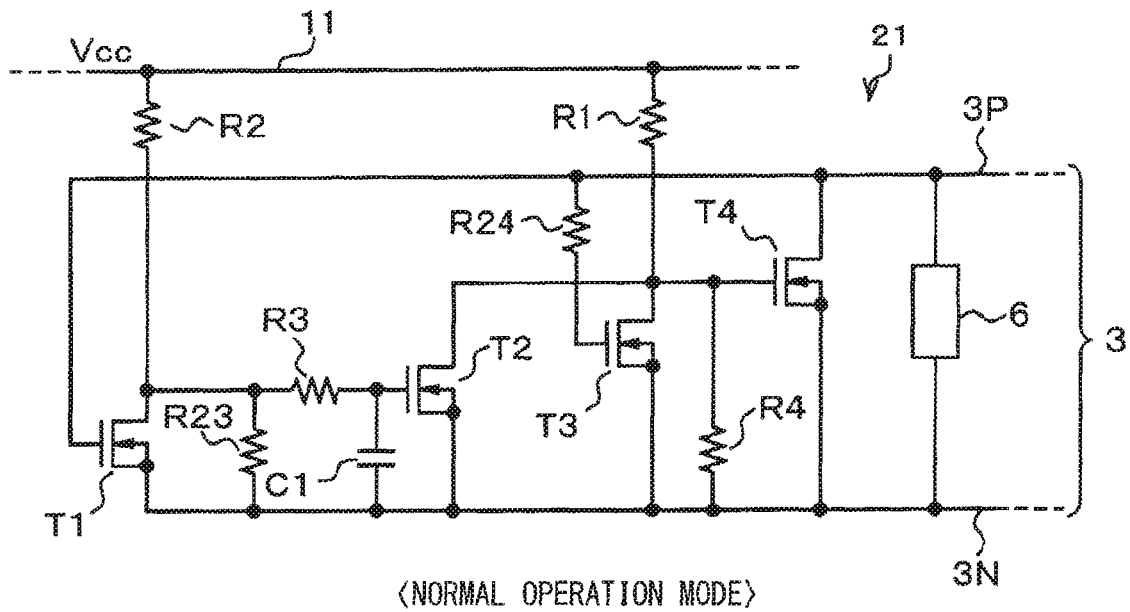
FIG. 9A illustrates schematically the circuit state of the ringing suppression circuit when setting the suppressor to the normal operation mode.
Figure 9B:
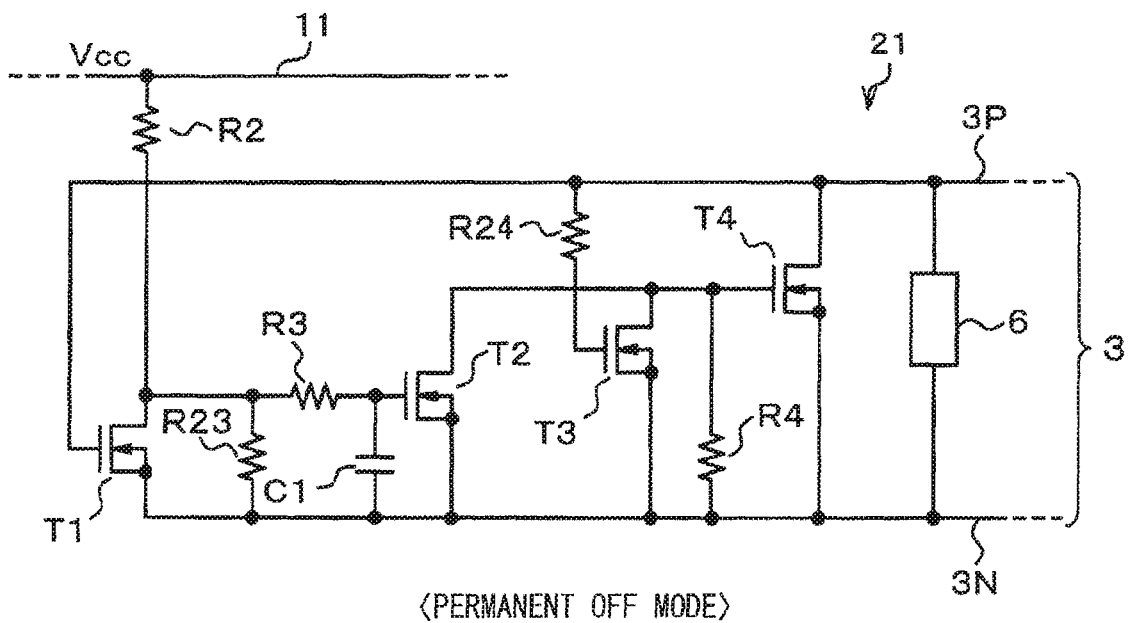
FIG. 9B illustrates schematically the circuit state of the ringing suppression circuit when setting the suppressor to the permanent off state.
Figure 9C:
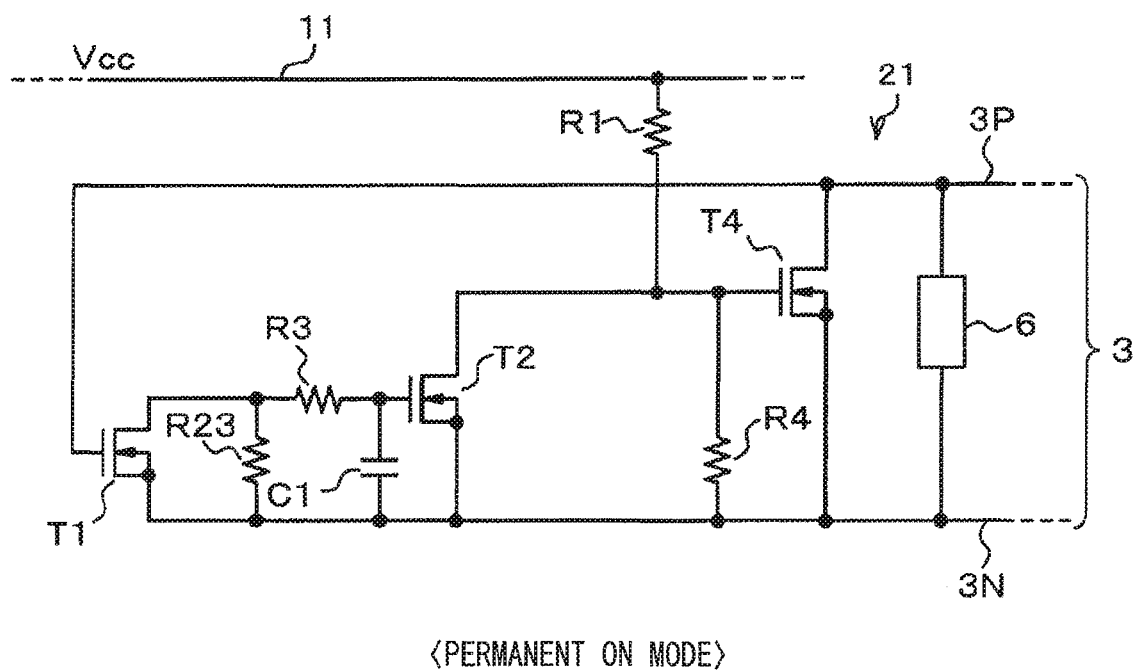
FIG. 9C illustrates schematically the circuit state of the ringing suppression circuit when setting the suppressor to the permanent off state.

The effect of the configuration is described with reference to FIG. 9A, FIG. 9B and FIG. 9C. It is noted that FIG. 9A, FIG. 9B and FIG. 9C omit the illustration of, for example, the OR circuit 24, the inverter circuit 25 and circuit elements, which do not function effectively.

[1] Normal Operation Mode

When the suppressor 22 is set to the normal operation mode, the selection signal SEL1 at the H-level and the selection signal SEL2 at the L-level are provided. Accordingly, the transistors T5 and T22 are turned on and the transistors T21 and T23 are turned off. As shown in FIG. 9A, the gate of the transistor T4 is at the pull-up state through the resistor R1; the drain of the transistor T1 is connected to the power supply line 11 through the resistor R2; and the gate of the transistor T3 is connected to the signal line 3P through the resistor R24.

The ringing suppression circuit 21 has a circuit configuration, which is similar to a typical ringing suppression circuit shown in FIG. 1 of JP 2012-247205 A. Accordingly, the ringing suppression circuit 21 shown in FIG. 9A can also carry out the ringing suppression operation, which is similar to the one carried out by the typical ringing suppression circuit. The suppressor 22 is set to the normal operation mode in FIG. 9A.

[2] Permanent Off Mode

When the suppressor 22 is set to the permanent off mode, the selection signal SEL2 at the H-level is provided. Accordingly, the transistors T5, T21 and T23 are turned off, and the transistor T22 is turned on. As shown in FIG. 9B, the gate of the transistor T4 is at the pull-down state through the resistor R4 on a steady basis. Thus, the transistor T4 is turned off on a steady basis regardless of the signal level of the differential signal. The ringing suppression circuit 21 shown in FIG. 9B does not carry out the suppression operation for suppressing the ringing on a steady basis. The suppressor 22 is set to the permanent off mode.

[3] Permanent on Mode

When the suppressor 22 is set to the permanent on mode, both of the selection signal SEL1 and the selection signal SEL2 at the L-level are provided. Accordingly, the transistors T5, T21 and T23 are turned on, and the transistor T22 is turned off. As shown in FIG. 9C, the gate of the transistor T5 is connected to the power supply line 11 through the resistor R1 on a steady basis. The transistor T4 is turned on on a steady basis regardless of the signal level of the differential signal. The ringing suppression circuit 21 shown in FIG. 9C carries out the suppression operation for suppressing the ringing on a steady basis. In FIG. 9C, the suppressor 22 is set to the permanent on state.

As described above, the ringing suppression circuit 21 according to the present embodiment may be set to the normal operation mode and the permanent off mode, which are the operation modes of the suppressor 22 similar to the operation modes in the ringing suppression circuit 5 according to the first embodiment. Therefore, the same effect as the first embodiment is achievable in the present embodiment.

The ringing suppression circuit 21 may be set to the permanent on mode, which is the operation mode of the suppressor 22, for carrying out the suppression operation on a steady basis. In the permanent on mode, the on-resistance of the transistor T4 is connected between the signal line 3P and the signal line 3N on a steady basis. When the ringing suppression circuit 21 is provided at the node 2 without having the termination resistor, the ringing suppression circuit 21 may function as the termination resistor in a situation where the ringing suppression circuit 21 is set to the permanent on mode. Therefore, it is not required to provide a termination resistor at the external part of the node 2. Hence, a decrease in manufacturing cost can be achieved.

Third Embodiment

The third embodiment is described with reference to FIGS. 10 and 11.

Figure 10:
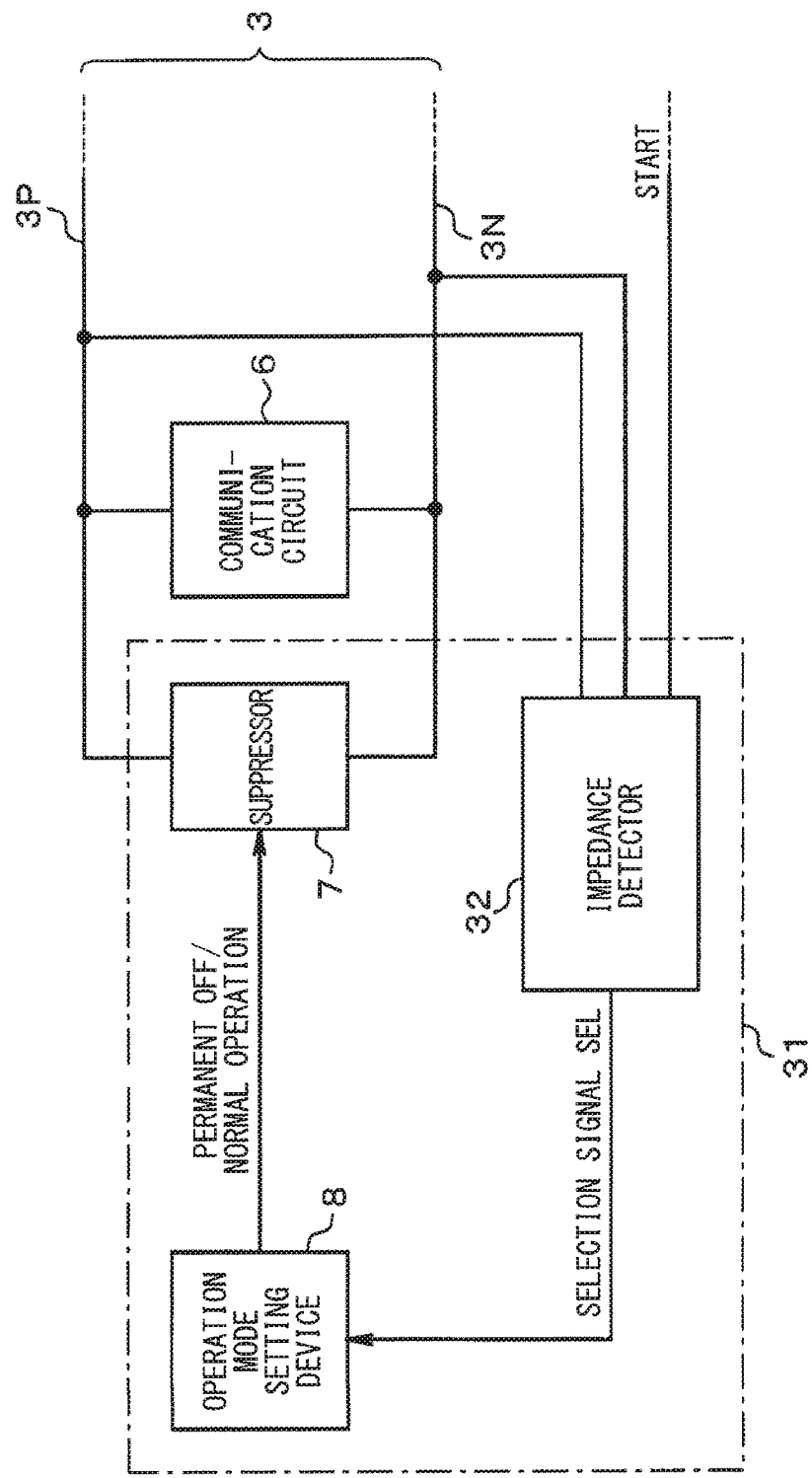
FIG. 10 illustrates schematically the configuration of a ringing suppression circuit according to a third embodiment.

As shown in FIG. 10, a ringing suppression circuit 31 according to the present embodiment includes an impedance detector 32 and configuration elements in the ringing suppression circuit 5 according to the first embodiment.

The impedance detector 32 detects an line impedance Z as the impedance between the signal lines 3P and 3N. Several techniques may be used for detecting the line impedance Z. For example, the predetermined current flowing between the signal lines 3P and 3N and the potential difference across the signal lines 3P and 3N may be detected and then the line impedance may be calculated based on the detected current and potential difference.

A start signal START is provided from outside as a trigger for the impedance detector 32 to start detecting the line impedance Z. The impedance detector 32 decides the logic value of the output selection signal SEL based on the value of the detected line impedance Z. Subsequently, the operation mode setting device 8 sets the operation mode of the suppressor 7 based on the signal level of the selection signal SEL provided from the impedance detector 32.

The relation between the signal level of the selection signal SEL and the operation mode is similar to the one described in the first embodiment. When the node 2 (electronic control device) provided with the ringing suppression circuit 31 is disconnected from the communication network 1, the start signal START is provided, for example, when the node 2 is activated or when the power supply is turned on for the ringing suppression circuit 31.

Figure 11:
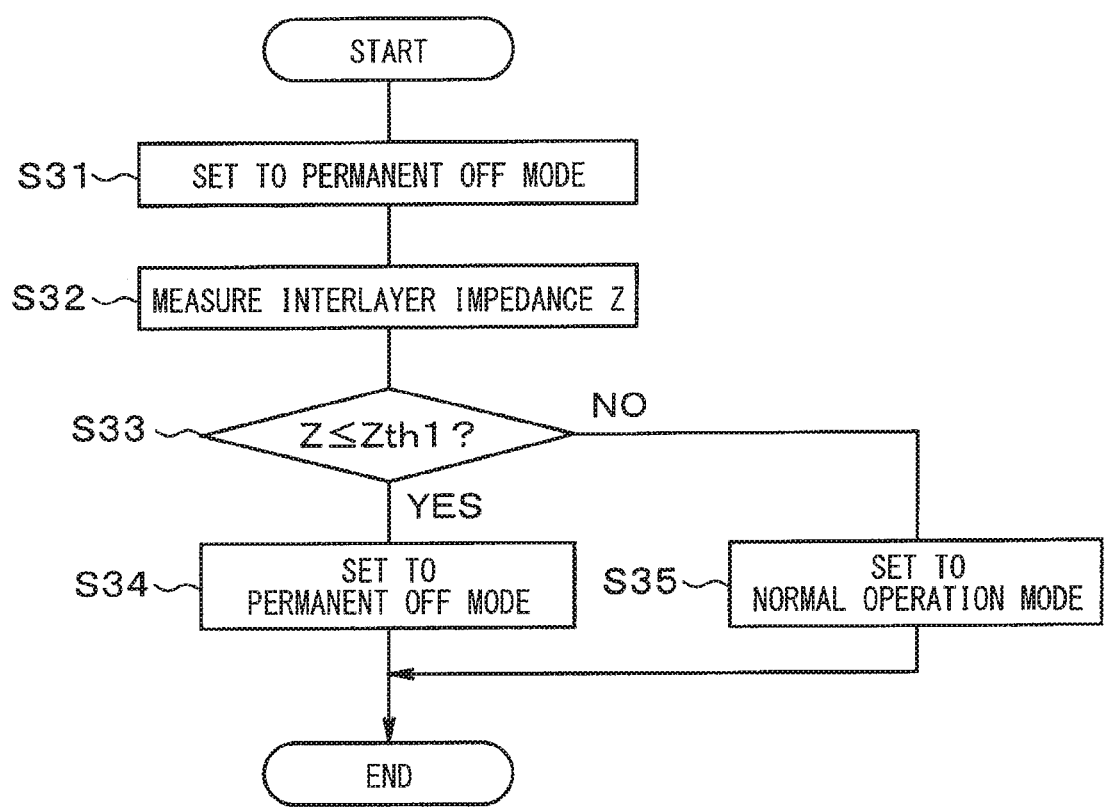
FIG. 11 is a flowchart that schematically illustrates the flow of a process for automatically setting the operation mode of the suppressor.

The following describes the function of the above configuration with reference to the flowchart in FIG. 11.

When the start signal START is provided, the process is shifted to step S31 to set the suppressor 7 at the permanent off state. When the following process is carried out, the suppressor 7 may be set at the normal operation mode in step S31 if there is no possibility in the transistor T4 of the suppressor 7 being turned on.

In step S32, the impedance detector 32 detects the line impedance Z. For simplicity, the value of the detected line impedance Z refers to the detection value Z. In the subsequent step S33, it is determined whether the detection value Z is smaller than or equal to a first threshold value Zth1.

The first threshold Zth1 refers to a threshold value that determines whether the node 2, which is provided with the ringing suppression circuit 31, has an external termination resistor. Accordingly, the first threshold value Zth1 may set to the resistance value (120 ohms) of the termination resistor or a value acquired by adding a margin value to the resistance value of the termination resistor. When the detection value Z is smaller than or equal to the first threshold value Zth1, it is determined that there is an external termination resistor at the node 2. When the detection value Z is larger than the first threshold value Zth1, it is determined that there is no external termination resistor at the node 2.

When it is determined that the detector Z is smaller than or equal to the first threshold value Zth1, in other words, when it is determined that there is an external resistor at the node 2 (affirmative determination "YES" in step S33), the process is shifted to step S34. In step S34, the suppressor 7 is set to the permanent off mode. When the detection value Z is larger than the first threshold value Zth1, that is, when it is determined that there is no external resistor at the node 2 (negative determination "NO" in step S33), the process is shifted to step S35. In step S35, the suppressor 7 is set to the normal operation mode. After the execution of step S34 or S35, the process is completed.

As described above, the ringing suppression circuit 31 according to the present embodiment determines whether there is an external resistor at the node 2 based on the detection value of the line impedance Z. If it is determined that there is a termination resistor, the suppressor 7 is set to the permanent off mode. If it is determined that there is no termination resistor, the suppressor 7 is set to the normal operation mode. According to the present embodiment, there is no need for a user to check whether there is a termination resistor at the node 2 to switch the operation mode of the suppressor 7. Since the operation mode of the suppressor 7 is automatically switched to the suitable operation mode according to the type of the node 2, the operation can be simplified while errors on setting operation mode can be reduced.

In the present embodiment, the detection of the line impedance Z is carried out when the suppressor 7 is set to the permanent off mode. When the line impedance Z is detected, the transistor T4 of the suppressor 7 is not turned on. Accordingly, it is possible to determine whether there is a termination resistor based on the detection value of the line impedance in a higher accuracy.

Fourth Embodiment

The fourth embodiment is described with reference to FIGS. 12 and 13.

Figure 12:
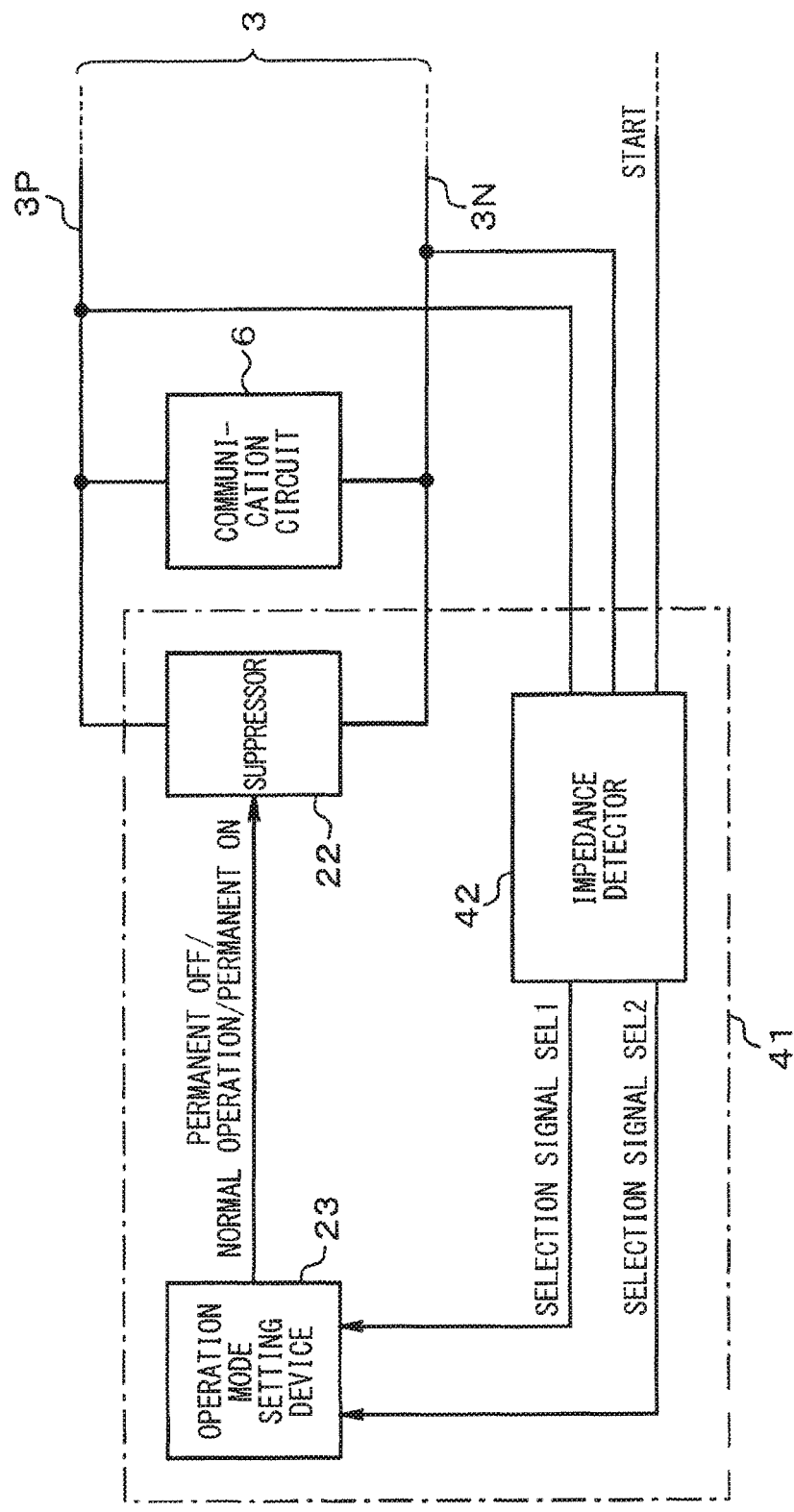
FIG. 12 illustrates schematically the configuration of a ringing suppression circuit according to a fourth embodiment.

As shown in FIG. 12, a ringing suppression circuit 41 according to the present embodiment includes each configuration element in the ringing suppression circuit 21 according to the second embodiment, and further includes an impedance detector 42.

The impedance detector 42 has a configuration, which is similar to the impedance detector 32 according to the third embodiment. The impedance detector 42 detects the line impedance Z and determines the logic values of the output selection signals SEL1 and SEL2 based on the detection value of the line impedance Z. The operation mode setting device 23 sets the operation mode of the suppressor 22 based on the respective signal levels of the selection signals SEL1 and SEL2 provided from the impedance detector 42.

The relation between the respective levels of the set operation mode is similar to the one described in the second embodiment. In this situation, when the node 2 (electronic control device) provided with the ringing suppression circuit 41 is connected to the communication network 1, the start signal START is provided when the node is activated or when the power supply is turned on for supplying power to the ringing suppression circuit 31.

Figure 13:
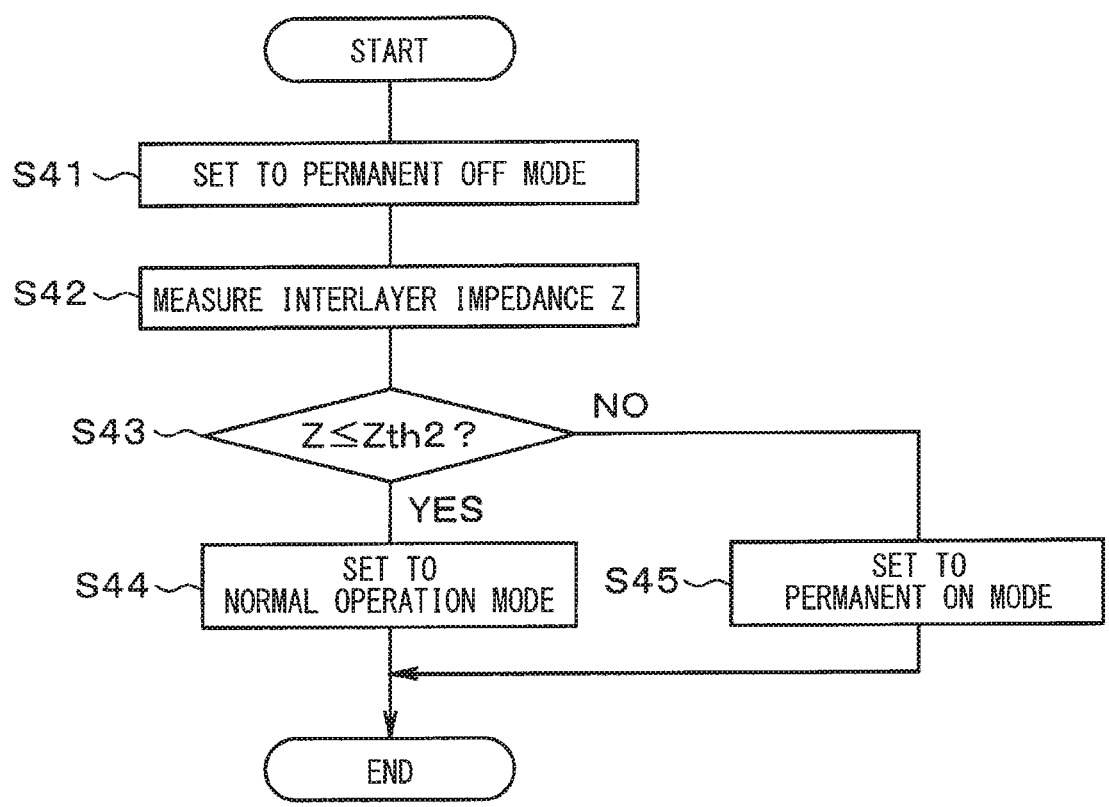
FIG. 13 is a flowchart that schematically illustrates the flow of a process for automatically setting the operation mode of the suppressor.

The following describes the function of the above-mentioned configuration with reference to the flowchart in FIG. 13.

When the start signal START is provided, the process is shifted to step S41, and the suppressor 22 is set to the permanent off mode. When the following process is carried out, the suppressor 22 may be set to the normal operation mode in step S41 if there is no possibility in the transistor T4 of the suppressor 22 being turned on. The following process is carried out when the communication is not executed between the other nodes 2.

In step S42, the line impedance Z is detected by the impedance detector 42. In the subsequent step S43, it is determined whether the detection value Z is smaller than or equal to the second threshold value Zth2. The second threshold value Zth2 refers to a threshold value to determine whether there are two termination resistors on the communication bus. The second threshold value Zth2 may be set to a half of the resistance value of the termination resistor (60 ohms) or a value acquired by adding a margin value to the resistance value. In a situation where the detection value Z is smaller than or equal to the second threshold value Zth2, it can be determined that there are two termination resistors on the communication bus. In a situation where the detection value Z is larger than the second threshold value Zth2, it can be determined that there is one termination resistor or no termination resistor on the communication bus.

When it is determined that the detection value Z is smaller than or equal to the second threshold value Zth2, in other words, when it is determined that there are two termination resistors on the communication bus (affirmative determination "YES" in step S43), the process is shifted to step S44. In step S44, the suppressor 22 is set to the normal operation mode. When it is determined that the detection value Z is larger than the second threshold value Zth2, that is, when it is determined that there is no termination resistor or one termination resistor on the communication bus (negative determination "NO" in step S43), the process is shifted to step S45. In step S45, the suppressor 22 is set to the permanent on mode. After the execution of step S44 or step S45, the process is completed.

As described above, the ringing suppression circuit 41 according to the present embodiment determines whether there are two termination resistors on the communication bus based on the detection value of the line impedance Z. When it is determined that there are two termination resistors, the ringing suppression circuit 41 sets the suppressor 22 to the normal operation mode. When it is determined that there is no termination resistor or one termination resistor on the communication bus, the ringing suppression circuit 41 sets the suppressor 22 to the permanent on mode. According to the present embodiment, there is no need for a user to check whether there are two termination resistors on the communication bus to switch the operation mode of the suppressor 22. The operation mode of the suppressor 22 is automatically switched to the suitable operation mode in response to whether there are two termination resistors. Thus, the operation can be simplified while errors on setting operation mode can be reduced.

For example, it is not necessary to install all of the nodes in the communication network 1 for a vehicle. The standard node 2 refers to a node which is necessarily to be installed in the network. The additional node 2 refers to a node to be installed according to the user's intention. The post-installed node 2 refers to a node to be installed later by the user. The configuration of the communication network 1 including the arrangement of the termination resistors is changed based on whether the additional node 2 or the post-installed node 2 (for example, an electronic device related to a navigation device) is installed or not. According to the configuration of the present embodiment, when the configuration of the communication network is changed by, for example, the installation of the post-installed node, the suppressor 22 is automatically switched to the suitable operation mode in response to the change.

Other Embodiments

It is to be noted that the present disclosure is not limited to the embodiments described above and illustrated in the drawings, and can be arbitrarily modified, combined, or expanded without departing from the scope thereof.

The configuration of the suppressor 7 or 22 may be modified as long as it carries out an operation to lower the impedance of the transmission line 3 in response to a change in the signal level of a differential signal for suppressing the ringing occurred with the transmission of the differential signal. For example, the configuration described in JP 2012-244220 A may be used for the suppressor 7 or 22. In other words, the configuration in which a plurality of switching elements connected in a series between the signal lines 3P and 3N may be used. Or alternatively, the suppressor 7 or 22 may be configured such that a switching element and a resistor are connected in series between the signal lines 3P and 3N. In this situation, the configuration of the operation mode setting device 8 or 23 may be modified according to the modification of the suppressor 7 or 22.

The communication protocol may not be limited to CAN. The communication protocol may be applied to any communication protocol which allows a differential signal to be transmitted through a pair of communication lines.

The present disclosure has been described with reference to working examples, but the present disclosure should not be limited to these working examples or the configurations. The present disclosure can include various modification examples as well as modifications made within equivalent ranges. Furthermore, various combination and formation, and other combination and formation including one, more than one or less than one element may be made within the spirit and scope of the present disclosure.

The invention claimed is:

1. A ringing suppression circuit provided at one or more nodes, each node having a communication circuit executing communication with another node by transmitting a differential signal through a pair of communication lines connected to the nodes, the ringing suppression circuit comprising:
   a suppression circuit configured to execute a suppression operation for suppressing ringing in the differential signal;
   an operation mode controller configured to set an operation mode of the suppression circuit to one of:
      a normal operation mode, which enables the suppression circuit to execute the suppression operation in response to detecting a change in a level of the differential signal; and
      a permanent off mode, which disables the suppression circuit to execute the suppression operation on a steady basis; and
   an impedance detector configured to detect a value of a line impedance as an impedance between the pair of communication lines and output a selection signal to select the operation mode of the suppression circuit based on the detected value,
   wherein the operation mode controller sets the operation mode of the suppression circuit based on the selection signal output from the impedance detector.

2. The ringing suppression circuit according to claim 1, further comprising:
   an input terminal configured to receive a selection signal to select the operation mode of the suppression circuit, and
   wherein the operation mode controller is configured to set the operation mode of the suppression circuit based on the selection signal.

3. A ringing suppression circuit provided at one or more nodes, each node having a communication circuit executing communication with another node by transmitting a differential signal through a pair of communication lines connected to the nodes, the ringing suppression circuit comprising:
   a suppression circuit configured to execute a suppression operation for suppressing ringing in the differential signal;
   an operation mode controller configured to set an operation mode of the suppression circuit to one of:

a normal operation mode, which enables the suppression circuit to execute the suppression operation in response to detecting a change in a level of the differential signal; and a permanent off mode, which disables the suppression circuit to execute the suppression operation on a steady basis; and an impedance detector configured to detect a value of a line impedance as an impedance between the pair of communication lines, and output a selection signal to select one of:

the permanent off mode as the operation mode of the suppression circuit in response to the detected value being smaller than or equal to a predetermined first threshold value; and the normal operation mode as the operation mode of the suppression circuit in response to the detected value being larger than the predetermined first threshold value, wherein the operation mode controller sets the operation mode of the suppression circuit based on the selection signal output from the impedance detector.

4. The ringing suppression circuit according to claim 3, further comprising:

an input terminal configured to receive a selection signal to select the operation mode of the suppression circuit, and wherein the operation mode controller is configured to set the operation mode of the suppression circuit based on the selection signal.

5. A ringing suppression circuit provided at one or more nodes, each node having a communication circuit executing communication with another node by transmitting a differential signal through a pair of communication lines connected to the nodes, the ringing suppression circuit comprising:

a suppression circuit configured to execute a suppression operation for suppressing ringing in the differential signal;

an operation mode controller configured to set an operation mode of the suppression circuit to one of:

a normal operation mode, which enables the suppression circuit to execute the suppression operation in response to detecting a change in a level of the differential signal; and a permanent off mode, which disables the suppression circuit to execute the suppression operation on a steady basis; and an impedance detector configured to detect a value of a line impedance as an impedance between the pair of communication lines, and output a selection signal to select one of:

the permanent on mode as the operation mode of the suppression circuit in response to the detected value being smaller than or equal to a predetermined second threshold value, and the normal operation mode as the operation mode of the suppression circuit in response to the detected value being larger than the predetermined second threshold value, and wherein the operation mode controller sets the operation mode of the suppression circuit based on the selection signal output from the impedance detector.

6. The ringing suppression circuit according to claim 5, further comprising:

an input terminal configured to receive a selection signal to select the operation mode of the suppression circuit, and wherein the operation mode controller is configured to set the operation mode of the suppression circuit based on the selection signal.

* * * * *